(12) United States Patent
Nishihara et al.

(10) Patent No.: US 7,779,199 B2
(45) Date of Patent: Aug. 17, 2010

(54) STORAGE DEVICE, COMPUTER SYSTEM, AND DATA WRITING METHOD

(75) Inventors: Toshiyuki Nishihara, Kanagawa (JP); Daisuke Yoshioka, Kanagawa (JP)

(73) Assignee: Sony Corporation, Tokyo (JP)

( * ) Notice: Subject to any disclaimer, the term of this patent is extended or adjusted under 35 U.S.C. 154(b) by 538 days.

(21) Appl. No.: 11/582,459

(22) Filed: Oct. 18, 2006

(65) Prior Publication Data

US 2007/0091679 A1    Apr. 26, 2007

(30) Foreign Application Priority Data

Oct. 20, 2005    (JP)    ............................ P2005-305540

(51) Int. Cl.
*G06F 12/00*    (2006.01)
*G06F 12/08*    (2006.01)
(52) U.S. Cl. ................ 711/103; 711/154; 711/E12.016
(58) Field of Classification Search ........................ None
See application file for complete search history.

(56) References Cited

U.S. PATENT DOCUMENTS

| | | | | |
|---|---|---|---|---|
| 5,191,556 A | * | 3/1993 | Radjy | ..................... 365/185.33 |
| 5,765,185 A | * | 6/1998 | Lambrache et al. | ......... 711/103 |
| 5,999,446 A | * | 12/1999 | Harari et al. | ............ 365/185.03 |
| 6,922,754 B2 | * | 7/2005 | Liu et al. | ..................... 711/138 |
| 2003/0056062 A1 | * | 3/2003 | Prabhu | ....................... 711/143 |
| 2004/0268049 A1 | * | 12/2004 | Madter | ....................... 711/133 |

FOREIGN PATENT DOCUMENTS

| | | |
|---|---|---|
| JP | 05-216775 | 8/1993 |
| JP | 06-349286 | 12/1994 |

OTHER PUBLICATIONS

"A 125mm2 1Gb NAND Flash Memory with 10MB/s Program Throughput," ISSCC 2002/Session 6/SRAM and Non-Volatile Memories/6.4, 2002 IEEE International Solid-State Circuits Conference, Feb. 4, 2002.

* cited by examiner

*Primary Examiner*—Reginald G Bragdon
*Assistant Examiner*—Eric Loonan
(74) *Attorney, Agent, or Firm*—Rader, Fishman & Grauer PLLC

(57) ABSTRACT

A storage device that includes: a flash memory device being a main storage medium; a cache memory for use for the flash memory device; and a control circuit. In the storage device, based on a write command and address information provided from outside, the control circuit selects either the flash memory device or the cache memory as a writing destination of input data.

10 Claims, 11 Drawing Sheets

FIG. 6

| | ADDRESS AREA | NUMBER OF SECTORS | NUMBER OF CONSUMED ENTRIES (a) | NUMBER OF ENTRY HITS (b) | NUMBER OF ENTRIES REQUIRED FOR ADDITION (a-b) | NUMBER OF ENTRIES REQUIRED FOR RELEASE |
|---|---|---|---|---|---|---|
| SUB BLOCK 1 | 0x0000C ~ 0x0000F | 4 | 1 | 1 | 0 | 0 |
| SUB BLOCK 2 | 0x00010 ~ 0x0001F | 16 | 4 | 3 | 1 | 1 |
| SUB BLOCK 3 | 0x00020 | 1 | 1 | 0 | 1 | 1 |

FIG. 11

| | ADDRESS AREA | NUMBER OF SECTORS | NUMBER OF CONSUMED ENTRIES (a) | NUMBER OF ENTRY HITS (b) | NUMBER OF ENTRIES REQUIRED FOR ADDITION (a-b) | NUMBER OF ENTRIES REQUIRED FOR RELEASE |
|---|---|---|---|---|---|---|
| SUB BLOCK 1 | 0x0080C ~ 0x00FFF | 2036 | 128 | 120 | 8 | 8 |
| SUB BLOCK 2 | 0x01000 ~ 0x01FFF | 4096 | 256 | 0 | 256 | 256 |
| SUB BLOCK 3 | 0x02000 ~ 0x0200C | 13 | 1 | 0 | 1 | 1 | und
STORAGE DEVICE, COMPUTER SYSTEM, AND DATA WRITING METHOD

CROSS REFERENCES TO RELATED APPLICATIONS

The present invention contains subject matter related to Japanese Patent Application JP 2005-305540 filed in the Japanese Patent Office on Oct. 20, 2005, the entire contents of which being incorporated herein by reference.

BACKGROUND OF THE INVENTION

1. Field of the Invention

The present invention relates to a storage device including a flash memory, a computer system using the storage device, and a data writing method and, more specifically, to a speed enhancement technology in the storage device for data transfer.

2. Description of the Related Art

In recent years, flash memories are receiving attention as a storage medium for use for digital still cameras or mobile computer equipment.

The flash memory is a semiconductor memory for storing therein data. For data storage, using electron tunneling or acceleration of hot electrons, electrons are injected to a floating gate or a trapping layer after being made to pass through a gate insulation film so that a threshold value of a cell transistor is changed. In such a semiconductor memory, only one transistor of multilayer gate or MNOS (Metal Nitride Oxide Semiconductor memory) structure can configure a memory cell so that the resulting memory can be inexpensive and large in capacity.

For such a semiconductor memory, a NAND flash memory is typically exemplified.

FIG. 1 is a diagram showing an exemplary internal configuration of a NAND flash memory.

The NAND flash memory of FIG. 1 includes a plurality of memory units 1-1 to 1-*n* in an array (in length and width directions). The memory units 1-1 to 1-*n* are connected to bit lines BL1 to BLn, respectively.

For example, a gate of a selection transistor 2 is connected to a selection gate line SL1, and a gate of another selection transistor 3 is connected to a selection gate line SL2. Gates of memory cells N0 to N15 are connected to word lines WL0 to WL15, respectively.

The memory cells N0 to N15 are each of multilayer gate structure, and store therein data in accordance with the amount of charge stored for a floating gate. That is, when a lot of electrons are stored in the floating gate, a transistor is increased in threshold value. For assessment of data, an access circuit 4 including a sense amplifier or others is used to detect whether there is a current flow from the charged bit lines BL1 to BLn to the memory units 1, i.e., 1-1 to 1-*n*.

Such a NAND flash memory has no need to include an area for every memory cell to come in contact with the bit lines. In this sense, the NAND flash memory is considered suitable for use as a medium of inexpensive large-capacity storage devices.

The issue here is that the flash memory is generally considerably slow in program speed, and requires several hundreds of μ seconds per cell. With the fact that no overwriting of data is possible, there needs to erase data before running of a program, and this takes several m seconds. To deal with such a problem, many memory cells are subjected to parallel processing.

That is, writing of a memory cell group 5, i.e., page unit, including cells all connected to the word line WL0 is performed collectively all at once, and erasing of a cell block 6 configured by page groups each sharing a memory unit is performed collectively all at once. Through such collective writing and erasing, the program is increased in transfer speed.

More specifically, Non-patent Document 1 (Digest of ISSCC2002, p 106, session 6.4) describes a NAND flash memory of 1 Gb, in which a page size is 2 kbytes, and an erase block size is 128 kB. That is, in a memory array, a memory cell group of 128 kbytes is erased in parallel, and a memory cell is programmed thereto in parallel for every 2 kbytes, thereby realizing the program transfer speed of 10 MB/s.

SUMMARY OF THE INVENTION

For solving problems relating to hard disks, i.e., the level of power consumption, the length of seek time, the shock resistance, portability, and others, flash memories are recently expected to take over the place of hard disks.

The concern here is that, as already mentioned above, the flash memories have a drawback of not being high in speed unless with the larger access unit. Also with the fact that no overwriting of data is possible, rewriting always requires erasing with a much larger-sized erase block.

The erase unit being several tens of times larger than the access unit is of general specifications for the flash memory that takes long for erasing, and causes a disturbance to any not-selected cell at the time of writing. Such specifications, however, reduce the writing efficiency to a considerable degree.

Exemplified here is a storage device as an alternative to a hard disk, configured by a flash memory having the transfer speed of 10 MB/s by page writing for every 2 kB and by block erasing for every 128 kB.

In such an exemplary storage device, when the transfer speed is to be increased up to 160 MB/s being a target value for serial-ATA-connection high-speed storages, there needs to put 16 memory arrays into parallel operation while establishing a structure of multibank or multichip.

FIG. 2 is a conceptual diagram of a flash memory configuring such a storage device.

In FIG. 2, for realizing high-speed transfer, 16 arrays AR0 to AR15 are put into operation at the same time. In this case, data writing is performed to pages P0 to P15 all at once, and data erasing is performed to blocks B0 to B15 all at once. With such collective data writing and erasing, a super page area 24 being a collective write unit reaches 32 kB, and a super erase block area 21 being a collective erase unit reaches 2 MB.

On the other hand, if with a normal file system, the size of a cluster being a minimum write unit is about 4 kB, which is used as a basis for random access.

In this case, exemplified is a request generated to ask for rewriting of only the pages P0 and P1.

With such an access in the device as described above, however, the super erase block area 21 has to be entirely erased after all. If the super erase block area 21 includes any effective file in its not-yet-selected area, the file has to be protected from losing. A typical measure there for is as follows.

1. First of all, data of the entire super erase block area 21 is read from a flash memory to a memory area 22 of a buffer memory 23, which is separately provided.

2. Next, in the memory area 22, data corresponding to the pages P0 and P1 is then updated.

3. The block area 21 on the flash memory is erased.

4. Lastly, updated block data of the memory area 22 is written back to the data-erased area 21.

That is, data writing of 4 kbytes is actually followed by data erasing, and data reading and writing of 2 MB.

More specifically, data reading and writing of a page takes 200 μs, respectively, and block erasing requires 2 ms, thereby requiring in total about 30 ms.

Alternatively, a data-erased block area 27 may be prepared in advance for backup use, and the block area 27 may be written with data. Herein, data to be written is the combination result of data originally in the block area 21 and the updated data of the pages P0 and P1.

With this being the case, a virtual address structure is used to update the correlation between a logic address and a physical address on an erase block basis. The physical block corresponding to the logic address determined as being an access target is moved from the original erase block area 21 to the block area 27 being a destination of data.

This also requires, however, the process of saving any effective data in the erase block area 21 to the block area 27 being a destination of data. In this case, generally, the original block area 21 is erased, and the backup block is put into use. As such, after all, this also requires data reading, writing, and erasing almost similarly as have been previously required, and there remains the problem of a large overhead.

For file updating, it is actually common to update, at the same time, not only any corresponding file but also a plurality of small areas related to the file, e.g., management domain or log description. There may be a case where a file itself is fragmented and scattered in a plurality of small areas.

Therefore, if there are constraints as described above, the actual transfer capability will be considerably poor.

Exemplified above is the data rewriting of 4 kbytes, but general file storage devices such as hard disks often support data rewriting in a much smaller unit of 512 bytes.

No matter how small the unit is for rewriting, however, the erase block has to be rewritten in its entirety as described above.

This is the reason why the current storage device using a flash memory has the transfer capability much poorer than that of the hard disk especially at the time of data writing. What is more, the redundancy as described above not only simply reduces the transfer capability to a further degree but also increases the erase frequency of the flash memory, and by extension, shortens the life expectancy thereof.

As a measure taken therefor, Patent Document 1 (JP-A-5-216775) and Patent Document 2 (JP-A-6-349286) describe the use of a cache memory.

Exemplified in such previous technologies is a case of storing block data or page data into the cache memory as an entry with no change. The block data is an erase unit of the flash memory, and the page data is a collective write unit. When the cache memory stores therein any block including data to be updated, i.e., if with a cache hit, only the data in the cache memory is updated so that the redundant operation as described above is not caused immediately.

However, the use of a cache memory as such does not always increase the efficiency. Exemplified here is a case of recording a file of huge amount of successive data, e.g., moving video. In this case, a cache miss is continuously observed during recording of the file, and there needs to release any existing entry for new entry addition. For this purpose, data of the same amount as the data written to the cache memory from outside is always written back from the cache memory to the flash memory. The process of data writing to the cache memory will result in an overhead incurred, thereby reducing the program capability contrary to expectations.

It is thus desirable to provide a semiconductor storage device and a computer system, and a data writing method, with which a small-capacity high-hit-rate low-access-overhead cache memory can be provided to a storage device with a main medium of flash memory, the writing to a flash memory can be increased in speed, and the frequency of data rewriting can be reduced.

According to a first embodiment of the present invention, there is provided a storage device that includes: a flash memory device being a main storage medium; a cache memory for use for the flash memory device; and a control circuit. Based on a write command and address information provided from outside, the control circuit selects, as appropriate, either the flash memory device or the cache memory as a writing destination of input data.

Preferably, a unit cell is set based on a write unit or an erase unit of the flash memory device, and the unit cell includes a plurality of sectors, and when a write command comes for writing of block data to any of the sectors or successive sector groups, the control circuit segments the block data into sub blocks in accordance with the unit cell, and selects either the flash memory device or the cache memory as the writing destination of each of the sub blocks in accordance with predetermined criteria for each of the sub blocks.

Still preferably, the unit cell includes one or more writing pages, and is a collective write unit of the flash memory device.

Still preferably, the control circuit subjects each of the sub blocks to a test to check the level of data occupation in the unit cell, and based on the test result, selects the writing destination for each of the sub blocks.

Still preferably, for each of the sub blocks, the control circuit checks an entry of the cache memory corresponding to the unit cell or data therein, and based on the check result, selects the writing destination for each of the sub blocks.

Still preferably, in data of any of the sub blocks whose writing destination is selected as the flash memory device, when there is data hit in the cache memory, the control circuit releases a corresponding entry on the cache memory.

Still preferably, in data of any of the sub blocks whose writing destination is selected as the flash memory device, when there is data hit in the cache memory, the control circuit updates a corresponding entry on the cache memory by the input data.

Still preferably, when the cache memory carries therein an entry corresponding to an area in the unit cell same as any of the sub blocks whose writing destination is selected as the flash memory device, the control circuit combines the entry with data of the sub block, and writes the resulting data back to the flash memory.

Still preferably, the unit cell includes one or more erase blocks, and is a collective erase unit of the flash memory device.

Still preferably, the control circuit subjects each of the sub blocks to a test to check the level of data occupation in the unit cell, and based on the test result, selects the writing destination for each of the sub blocks.

Still preferably, for each of the sub blocks, the control circuit checks an entry of the cache memory corresponding to the unit cell or data therein, and based on the check result, selects the writing destination for each of the sub blocks.

Still preferably, for each of the sub blocks, the control circuit checks a free space on the flash memory device for the unit cell, and based on the check result, selects the writing destination for each of the sub blocks.

According to a second embodiment of the present invention, there is provided a computer system that includes: a processing unit that runs application software; a flash memory device being a file storage; and a cache memory area for use for the flash memory device. In the computer device, under the control of driver software, the processing unit receives a command from the application software for writing to the file storage, and based on address information, selects either the flash memory device or the cache memory area as a writing destination of input data.

According to a third embodiment of the present invention, there is provided a data writing method for a storage device including a flash memory device, and a cache memory area for use for the flash memory device. The method includes the steps of: setting a unit cell including a plurality of sectors based on a write unit or an erase unit of the flash memory device; segmenting block data into sub blocks in accordance with the unit cell when a write command comes for writing of the block data to any of the sectors or successive sector groups; and selecting either the flash memory device or the cache memory area as the writing destination of each of the sub blocks in accordance with predetermined criteria for each of the sub blocks.

The problems observed with a storage system equipped with a general type of cache memory are resulted from the fact that, irrespective of what circumstances, input written data never fails to be written to the cache memory for once.

On the other hand, the storage device according to the embodiments of the invention selects, as appropriate, either a cache memory or a flash memory as a writing destination of input data based on a write command and address information coming from outside. Based on the selection result, the cache memory side is put in charge of updating small-sized areas or writing of small-sized files, and large-sized files including successive data is directly written to the flash memory. This is because updating of small-sized areas is burdensome for the flash memory in terms of writing, and writing of large-sized files is often resulted in waste in the cache memory.

The invention enables to provide a small-capacity high-hit-rate low-access-overhead cache memory to a storage device with a main medium of flash memory, increase the speed of writing to a flash memory, and reduce the frequency of data rewriting.

With such a system, a flash memory can be used as a high-speed hard disk, and the resulting storage system can be low in standby power consumption, and high in speed and compact in size.

BRIEF DESCRIPTION OF THE DRAWINGS

FIG. 6 is a diagram showing exemplary cell segmentation and determination criteria of the first embodiment;

FIG. 11 is a diagram showing exemplary cell segmentation and determination criteria of the second embodiment;

DETAILED DESCRIPTION OF THE INVENTION

In the below, embodiments of the invention are described with a correlation with the accompanying drawings.

Figure 1:
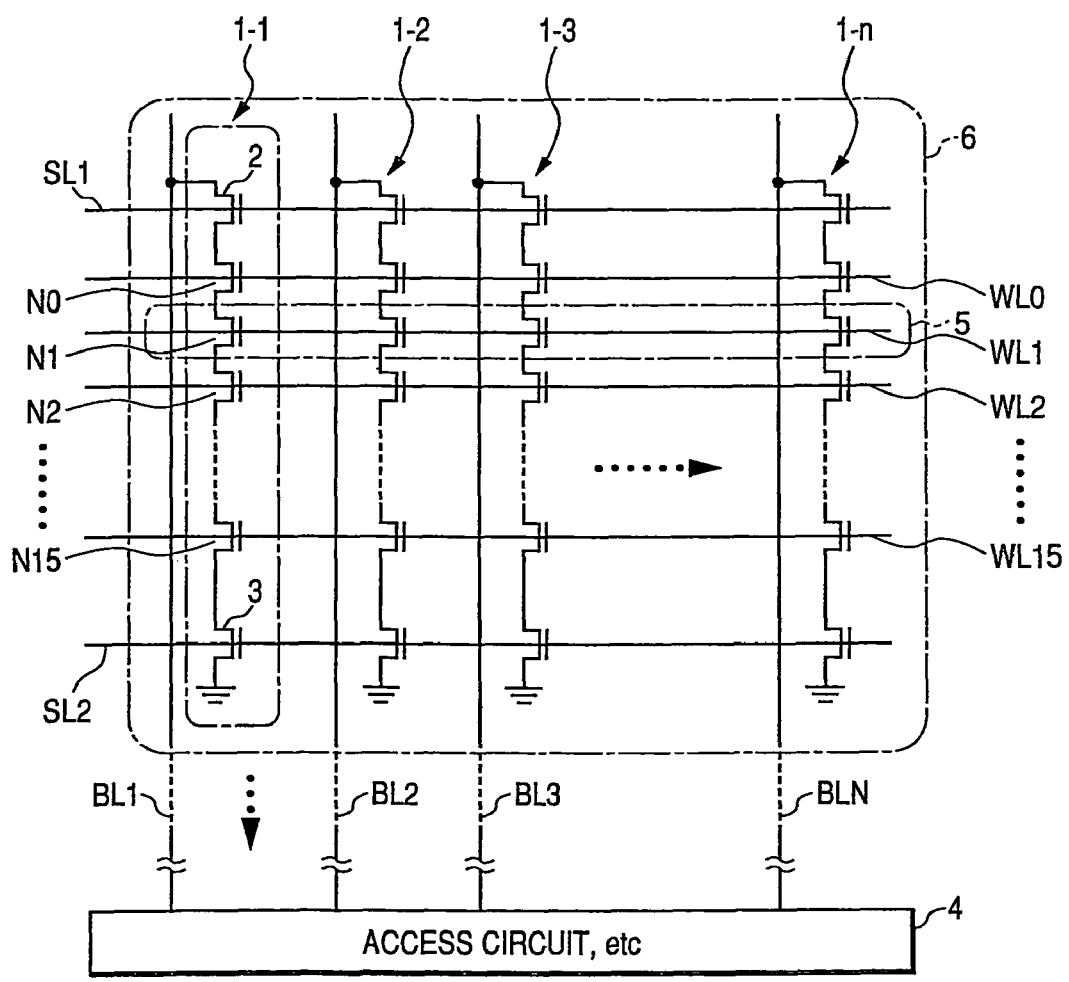
FIG. 1 is a diagram showing an exemplary internal configuration of a NAND flash memory.
Figure 2:
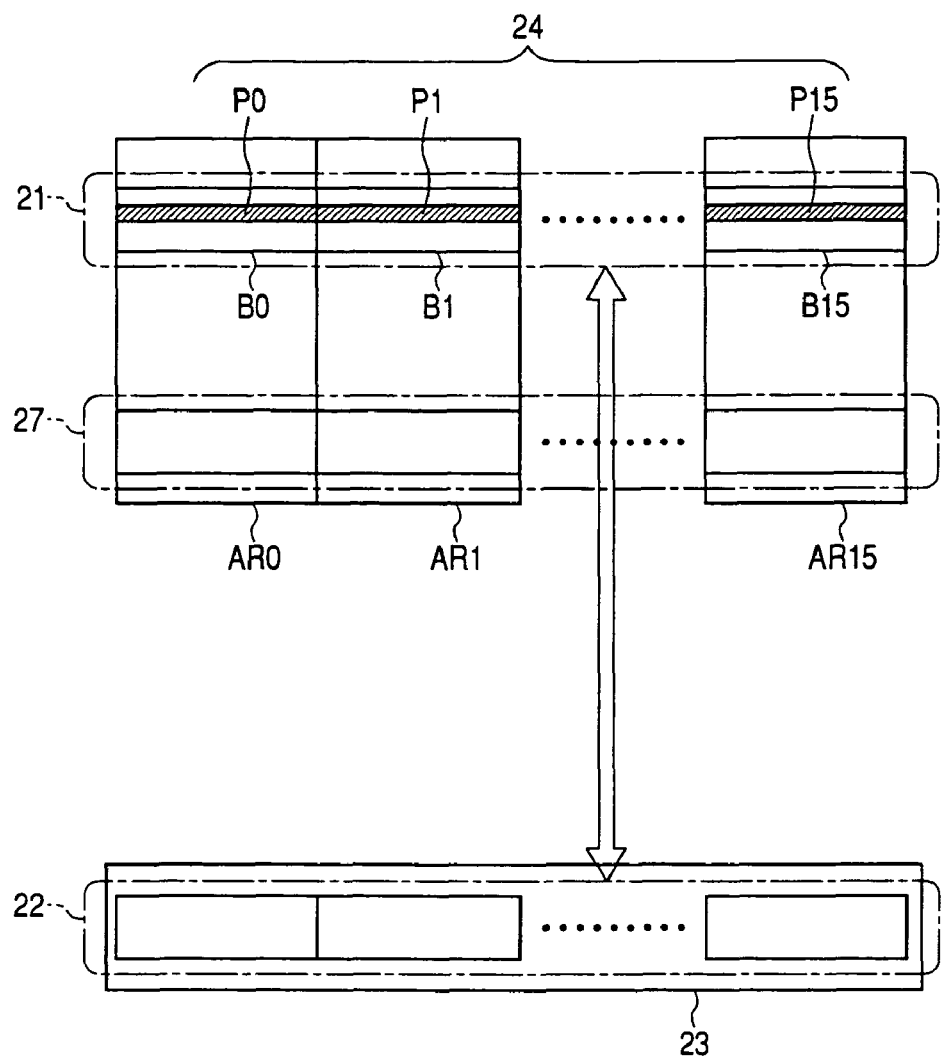
FIG. 2 is a conceptual diagram of a flash memory configuring a storage device.
Figure 3:
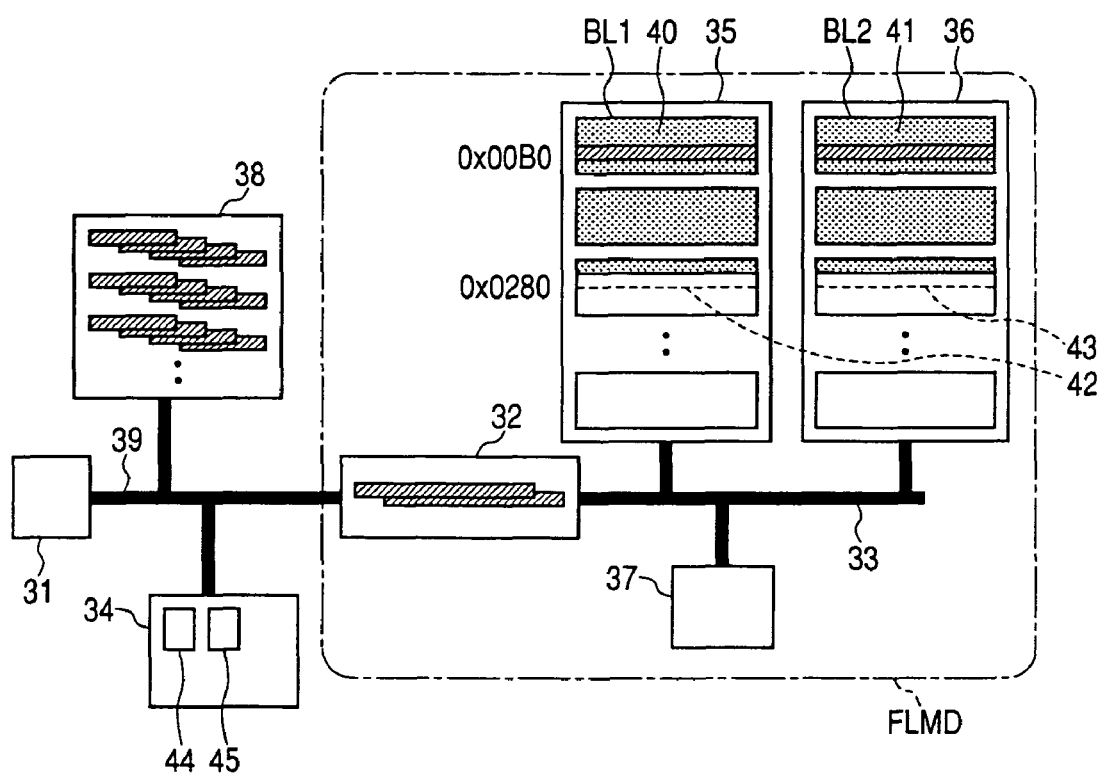
FIG. 3 is a diagram showing the configuration of a file storage device of a first embodiment of the invention.

FIG. 3 is a diagram showing the configuration of a file storage device of a first embodiment of the invention.

A file storage device 30 is configured to include an interface circuit (I/F) 31, a page buffer 32, a memory bus 33, a control circuit 34, NAND flash memories 35 and 36, a control circuit 37, a cache memory 38, and an internal bus 39. Reference numerals 40 to 43 each denote a page area, and the control circuit 34 includes an address conversion table 44, and a cache management table 45.

A flash memory device FLMD is formed by the components, e.g., the page buffer 32, the memory bus 33, the NAND flash memories 35 and 36, the control circuit 37, and the internal bus 39.

In the file storage device 30, the 32-bit memory bus 33 is connected in parallel with the two-chip NAND flash memories 35 and 36 having an input/output of 16 bits. The two-chip NAND flash memories 35 and 36 are accessed simultaneously in parallel for data reading and writing.

The flash memories 35 and 36 each make an access for data writing and reading for every page of 4 kB, for example.

As the super page size, 8 kB is thus collectively accessed.

The page buffer 32 temporarily stores therein data of any accessed page area.

The data exchange among the flash memories 35 and 36 and the page buffer 32 is under the control of the control circuit 37.

The control circuit 37 also applies error correction to transfer data as required by ECC coding, or manages any defective block in the flash memories. The flash memories 35 and 36 receive/forward data from/to the internal bus 39 of the file storage device 30 via the page buffer 32.

That is, the circuit group FLMD including the flash memories 35 and 36 or the page buffer 32 and the transfer control circuit 37 connected on the memory bus 33 configures substantially one flash memory device, and is regarded as being connected to the internal bus 39 of the storage device 30.

The internal bus 39 is connected with the cache memory 38 for data writing, the I/F circuit 31, and the control circuit 34.

The I/F circuit 31 takes charge of data or command exchange with a host in accordance with specifications such as ATA (Advanced Technology Attachment) or PCI (Peripheral Component Interconnect) express.

The control circuit 34 manages data exchange inside of the file storage device 30, i.e., among the page buffer 32, the cache memory 38, and the I/F circuit 31. A RAM (Random Access memory) equipped in the control circuit 34 configures the address conversion table 44 for managing virtual addresses on a page basis, and the management table 45 of the cache memory 38.

Similarly to a hard disk or others, the storage device 30 makes an access for every sector of 512 Bytes. For brevity, inside of the device, hexadecimal addresses are presumed as being assigned as below.

Assuming that an external input address is "0x5500C", the high-order 16 bits of "0x5500" is a page address, and the low-order 4 bits of "0xC" is a sector address in the page area. A page includes 16 sectors.

The storage device 30 is capable of random access on a sector basis, and as will be described later, the random access is performed via the page buffer 32 or the cache memory 38.

An entry for the cache memory 38 includes ¼ of a super page, i.e., 4 sectors. Accordingly, such an entry is managed with high- and mid-order 2 bits of the 4-bit sector address in addition to the corresponding page address of 16 bits.

In the above example, with the super page size of 8 kB, the size of an entry is 2 kB. Exemplarily with a 182-kB RAM serving as a cache memory, about 64 entries will be possible.

Figure 4:
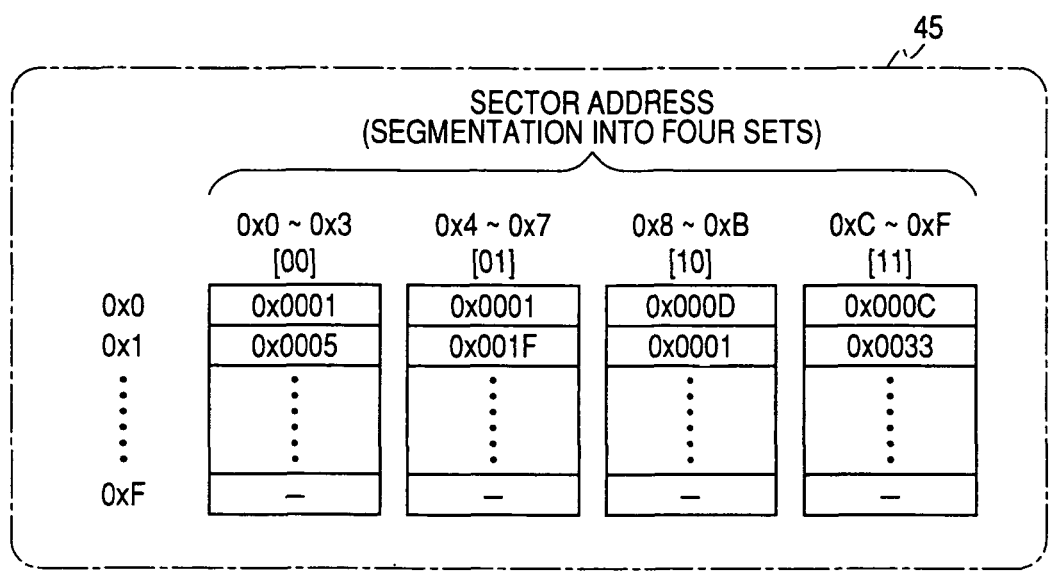
FIG. 4 is diagram showing an exemplary configuration of a cache memory management table of the first embodiment of the invention.

FIG. 4 is a diagram showing an exemplary configuration of the cache management table 45 of the cache memory.

In FIG. 4 example, considering the ease of table management and a hit rate, four sets are configured with an index of high-order 2 bits of the sector address in the page. The sets each separately include 16 entries. That is, the sets are each of set-associative structure with 4 sets 16 ways. In the table, each field stores therein a page address corresponding to each of entries if any.

Exemplary with an access request coming from outside for a sector of address "0x5500C", the high-order 2 bits of the sector address "0xC" are used as an index, and a set corresponding to "11" is selected.

Thereafter, a search is made for the selected set to find 16 entries at maximum, and a determination is then made whether there is any entry corresponding to the page address of "0x5500".

This embodiment adopts virtual address management on a page basis.

Figure 5:
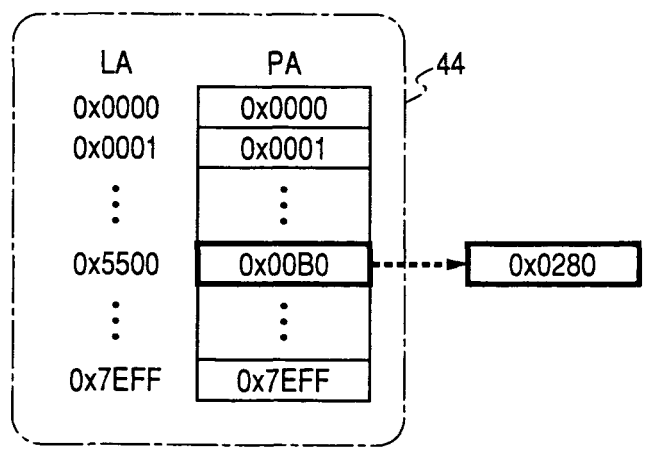
FIG. 5 is a diagram showing an exemplary configuration of an address conversion table.

FIG. 5 is a diagram showing an exemplary configuration of the address conversion table 44.

An access is made to the memory specifically as below.

At the time of reading, when a sector address of "0x5500C" is input from outside, the control circuit 34 first refers to the cache table 45 to determine whether there is a cache hit. If there is a cache hit, the data is accordingly read from the cache memory (46).

If with a cache miss, on the other hand, any corresponding super page is read from the flash memories 35 and 36 to the page buffer 32 in the following procedure.

First of all, an access is made to the internal RAM in response to the page address of "0x5500", and a physical page address (PA: PHYSICAL ADDRESS) "0x00B0" is acquired from the address conversion table 44. The physical page address PA here is the one corresponding to a logical page address (LA: LOGICAL ADDRESS) "0x5500".

In the physical page address PA, the high-order "0X00" is a memory chip, i.e., the address of the erase blocks BL1 and BL2 in the flash memories 35 and 36.

The low-order "0xB0" is the address of the page areas 40 and 41 in the respective erase blocks. Based on this physical page address, the flash memories 35 and 36 each being a memory chip are both accessed, and data of the page areas 40 and 41 stored in the page address "0x00B0" is read. Thus read data is stored in the page buffer 32.

From the data, the I/F circuit 31 selects a sector corresponding to the low-order address "0xC", and outputs the result to outside.

For writing to the cache memory 38, the writing can be performed at high speed on a sector basis.

For writing to the flash memories 35 and 36, any corresponding super page is read from the flash memories 35 and 36 to the page buffer 32 in the similar manner to the data reading. After page reading as such, there needs to rewrite any corresponding sector on the page buffer 32, and write the result back onto the flash memories.

The rewriting of only one sector goes through the same procedure, requiring data reading and rewriting of the whole of a super page, i.e., 16 sectors.

As described above, writing to the flash memories 35 and 36 takes time, and some configuration has constraints associated with data erasing. Therefore, the performance of the flash memories 35 and 36 is considerably poor compared with writing to the cache memory 38.

Note here that, for writing to the cache memory 38, if there is any cache miss, and if the memory has no free space for entry addition, any existing entry has to be once released to make some space available. The data of thus released entry has to be written back to the flash memories after all, and the operation is similar to the writing to the flash memories.

With interface specification in a general file storage, e.g., ATA, a data access is made in response to a transfer command for every block configured by several successive sectors.

For example, the command is exchanged in such a form as "perform writing to xx pieces of sector groups from the head address xxx". As described above, because the cache memory has the writing performance considerably different from that of the flash memory, optimizing the access procedure depending on the block configuration will be significant to increase the performance.

In the embodiment, the transfer block as above is segmented into cells for every super page, and the access procedure is determined for every unit cell.

Exemplified here is the writing of block data covering the range of sector addresses "0x0000C" to "0x00020". The block data is segmented into three sub blocks based on the page addresses as below.

Cell 1 (sub block 1): "0x0000C" to "0x0000F"
Cell 2 (sub block 2): "0x00010" to "0x0001F"
Cell 3 (sub block 3): "0x00020"

For each of the sub blocks segmented as such, the optimum writing destination is selected. Described below are exemplary determination criteria by referring to FIG. 6.

Considered here is a measure to be taken against the worst case, i.e., the entries of the cache memory are all full, and every writing sector results in a cache miss.

To perform writing in such a case, as described above, there needs to release the entries as many as needed for writing, and write the data in the released entries back to the flash memories. As a result, the larger the data size for writing, the likelier it becomes that the processing amount therefor is increased, and the disadvantages of using the cache memory become more obvious.

For example, the sub block 2 is configured by 16 sectors, and includes the whole (entire) of a super page "0x0001". Storing the sub block 2 into the cache memory 38 consumes four entries. With this being the case, there needs to release the four entries at worst belonging to each different page, and to perform writing of four pages to the flash memories.

That is, there needs to repeat four times the operation of reading the super page data from the flash memories 35 to 36 to the page buffer 32, and writing the super page data again to the flash memories after updating the data area corresponding to each of the entries.

On the other hand, if this sub block is written to the flash memories as it is, the writing will do for a page. As such, in such a case, writing to the cache memory will cause adverse effects if anything.

On the other hand, the sub block 1 is configured by four sectors, and the sub block 3 by a sector. The sub blocks 1 and 3 consume, respectively, only an entry of the cache memory 38. Accordingly, even in the worst case as above, one entry is to be released from the cache memory, and data of the entry is to be written again to the flash memories so that writing to the flash memories will do for a page. When there is a cache hit in the cache memory 38, or when the memory has any free space for entry addition, the processing can be completed at high speed without making an access to the flash memories 35 and 36. Accordingly, writing this sub block to the side of the cache memory 38 will lead to better efficiency most of the time.

With an effective writing technique, the sub blocks as a result of segmentation on a super page basis are each subjected to a test to see the level of data occupation in the super page, and based on the test result, a writing destination is selected either a flash memory or a cache memory for the data.

As an example, the determination criteria are set to the number of sectors for writing to each of the sub blocks. When there are five or more sectors for writing, writing is performed to the flash memories 35 and 36, and if with four or less sectors, writing is performed to the cache memory 38. Alternatively, the number of entries to be consumed at the time of writing to the cache memory may be used as the determination criteria. If this is the case, when two or more entries are to be consumed, writing is performed to the flash memories, and if with one entry, writing is performed to the cache memory.

The number of sectors in each of the sub blocks or the number of entries to be consumed can be instantaneously captured from address information. Accordingly, by selecting a writing destination for data as appropriate using such a determination algorithm, the writing efficiency and performance can be both increased with ease.

For more accurate detailed determination, the entries of the cache memory may be subjected to a test.

More in detail, prior to writing, a test is executed to see whether there is a cache hit or not for the data belonging to any of the sub blocks. The test is of making a search of the cache table 45 based on the address information. The test result tells in advance before writing of the sub block to the cache memory, how many entries are to be required for addition. With such determination criteria, the selection can be made with more accuracy.

Even if the sub block 2 consumes four entries, as long as the cache memory 38 carries therein 23 entries, i.e., with 23 cache hits, only one entry will be added. For example, when there needs to add two or more entries, writing is performed to the flash memories 35 and 36 with no change, and when there needs to add only one entry, writing is performed to the cache memory 38.

Alternatively, considering the free space available in the cache memory 38, the number of entries to be released may be used as selection criteria. In this case, if three entries are required to be added, when any two corresponding sets have some free space, only one entry will be released. For example, when two or more entries are required to be released, writing is performed to the flash memories 35 and 36 with no change, and when only one entry is required to be released, writing is performed to the cache memory 38.

It is also effective, at the same time when the sub block is written to the flash memories 35 and 36, to execute a test to see which data can be written again from the cache memory 38, and use the test result for determination use.

Assuming that the sub block 1 is to be written to the flash memories as it is, the cache table 45 is searched for any entry corresponding to the same cell 1. That is, although the sub block 1 belongs to the logic page address LA "0x0000", if any entry corresponding to the same page is in the cache memory 38, the data can be written again to the flash memories 35 and 36 at the same time.

The entry will be cleared, and may be released as required. In this case, even if data of the sub block for writing is of four sectors (one entry), a lot of data is actually written from a plurality of entries, and writing is performed with efficiency. For example, the total number of sectors that can be simultaneously written to the flash memories 35 and 36 is used as criteria, and when the value is larger than a predetermined value, writing is performed to the flash memories as it is, and when the value is equal to or smaller than the predetermined value, writing is performed to the cache memory 38.

As such, there are various types of selection algorithm, which can be combined together as appropriate.

The basic writing procedure in the storage device of the embodiment of the invention is as follows.

1. An input command and address information are acquired.

2. Based on cells of a writing page, block data is segmented into sub blocks, and each of the sub blocks is sequentially subjected to a writing process.

3. At this time, a test is executed to see the level of data occupation in the sub blocks, or entries in the cache memory are checked, and based on the test result, a writing destination is selected.

With the determination of 3 above, for each of the sub blocks, it is preferable to determine a selection algorithm considering the time needed for determination and the complication level of the processing in view of:

reducing the substantial writing frequency to the flash memories in consideration of entry release in the cache memory; and when the flash memories need an access, achieving simultaneous writing of sectors as many as possible.

Described below is the procedure of writing block data.

Figure 7:
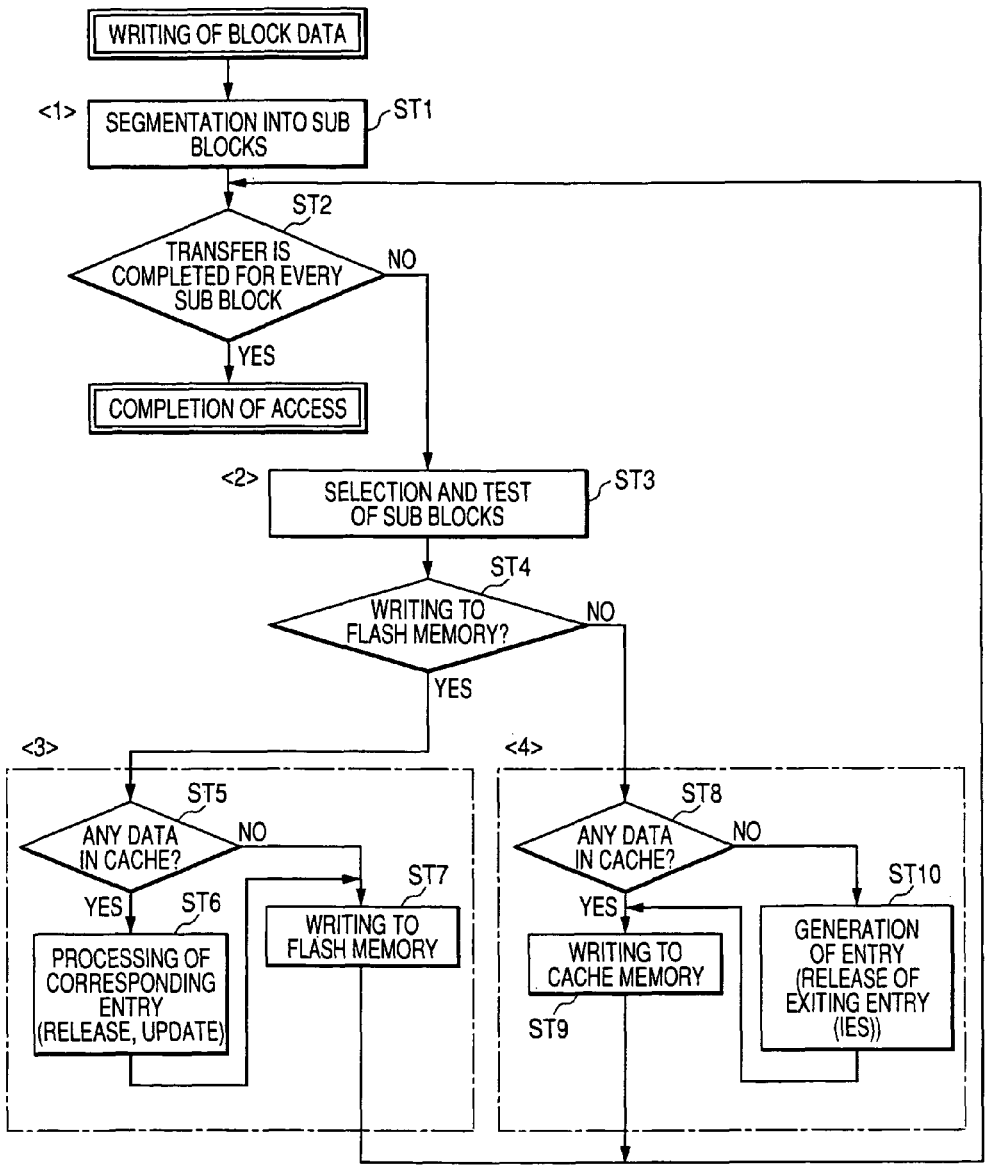
FIG. 7 is a flowchart of a block data writing process of the first embodiment.
Figure 8:
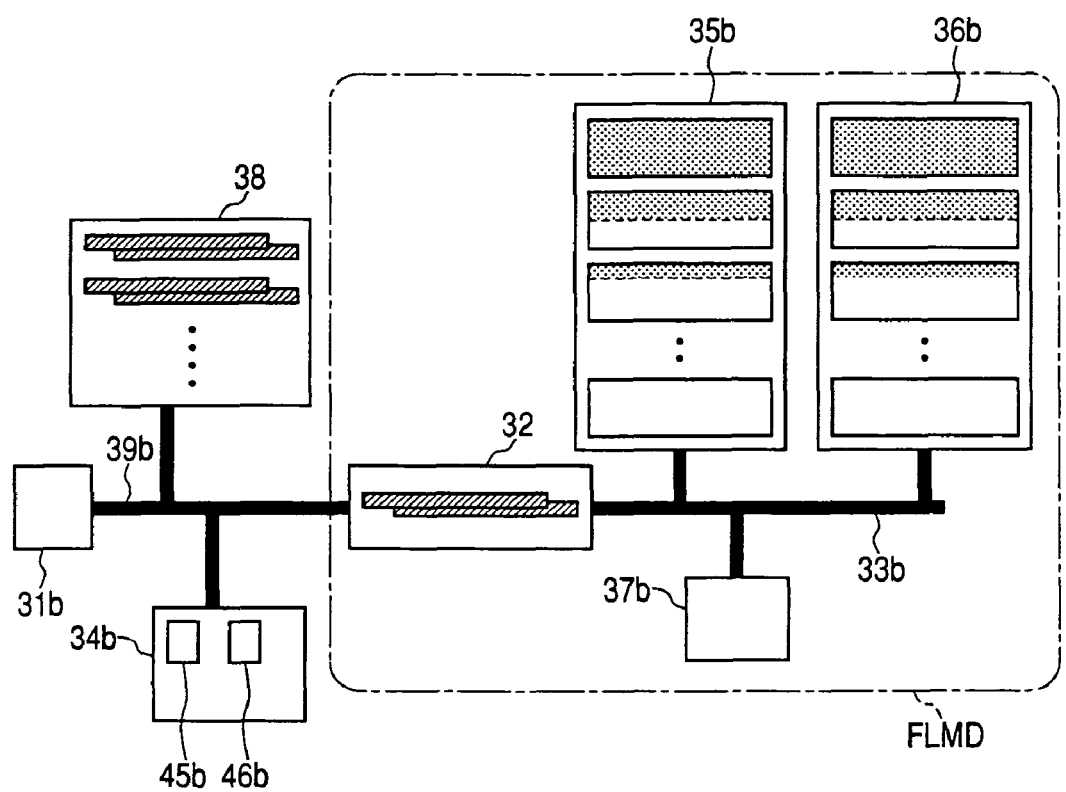
FIG. 8 is a diagram showing the configuration of a file storage device of a second embodiment of the invention.

FIG. 7 is a flowchart of a block data writing process in the embodiment. Assumed here is that an external designation is made for a head address on a sector basis and the number of sectors for writing, and block data of sector or a plurality of successive sectors is input. The sector is a basic access unit for the general file storage, and is of generally 512 Bytes. This size is not surely restrictive.

<1> Segmentation of Block Data

The control circuit 34 segments any incoming block data in accordance with a super page as described above, and the following process is applied to each of the sub blocks (ST1) The writing process is generally started in order from the sub block including the cell of the head sector. When every sub block is through with writing, this is the end of the process (ST2).

<2> Sub Block Writing Process

In the sub block selected as a processing target, the level of data occupation is tested in the cell, and whenever necessary, a test is executed to the entries in the cache memory 38 corresponding to the cell of the sub block or the data therein (ST3). Based on such information, a determination is made whether the sub block is written to the flash memories 35 and 36 as it is or to the cache memory 38 (ST4).

When such a test is executed to the entries, information about any data-hit entry or others is stored in the memory in the control circuit 34 or a register.

<3> Writing to Flash Memory

When the flash memory is selected as a writing destination of the sub block, the entries of the cache memory corresponding to the data are first tested, and when there is any corresponding entry, the process is executed for matching. When the entries are already tested in the process of <2>, there is no need to search the cache table 45 again.

Thereafter, the sub block is written to the flash memories as below.

First of all, the page data corresponding to the cell of the sub block is read from the flash memories 35 and 36 to the page buffer 32, and is updated by the data of the sub block. When the sub block covers the entire of the page, this reading process can be skipped. The details of the page buffer 32 are then written back to the flash memories 35 and 36 (ST5 to ST7)

<4> Writing to Cache Memory

Also in the case where the cache memory 38 is selected as a writing destination of the sub block, the entries of the cache memory 38 corresponding to the data are checked. When the entries are already tested in the process of <2>, there is no need to search the cache table 45 again.

The hit sector is written to the corresponding entry as it is. To any cache-miss sector, anew entry is added for writing thereto. At this time, when any existing entry is required to be released, any arbitrary entry is released fist, and the data thereof is written back to the flash memories (ST8 to ST10).

In the process of <3>, when the sub block is written to the flash memory side, any data-hit entry is processed for matching with the cache memory 38.

With the embodiment of the invention, even if the data of the sub block is partially hit the cache memory 38, a selection may be made to write the data to the flash memory side. In this case, the data in the cache memory is not recent ay more so that a measure has to be taken therefor.

Specifically, the data of the entry is updated by the data of the sub block or the hit entry itself is released.

For writing of the sub block to the flash memories 35 and 36, as described above, the cache table 45 is searched for sectors in the same cell (same page) but not in the sub block. When there is any hit entry, i.e., corresponding to the same page as the writing destination, the data thereof is preferably written to the flash memories at the same time. The written-back entry is cleared, and can be released whenever necessary.

When the entry is written back, various types of data is combined on the page buffer 32 as below, for example, and a complete super page is structured before writing to the flash memories 35 and 36.

First of all, any corresponding page is read from the flash memories 35 and 36 onto the page buffer 32. The page is then overwritten by the effective data of the entry corresponding to the same cell of the cache memory. The data of the sub block is then overwritten, and the result is written back to the flash memories 35 and 36.

Note here that the operation of writing the page back to the flash memories 35 and 36 from the page buffer 32 will be increased in efficiency if with the following addendum-type rewriting.

For rewriting of the page of logic page address LA "0x5500", the corresponding physical pages in the address conversion table 44 are 40 and 41 at the address location of "0x00B0". For rewriting the page as it is, however, there needs to go through a saving process or others to the effective page in the entire erase block as described above.

In consideration thereof, in the embodiment, the page data after update is written to any arbitrary free areas 42 and 43. The physical page address PA of the page area is "0x0280", i.e., corresponds to the page of "0x80" in the erase block "0x02".

Before this process, no physical address field in the address conversion table 44 includes the page area, and the page area is an available free page. The updated data is written to this area as an addendum, and the physical address field corresponding to the logic page address LA "0x5500" of the address conversion table 44 is entered with the physical page address PA "0x0280" of the areas 42 and 43.

That is, in the embodiment, writing of the super page data back to the flash memories 35 and 36 is made by writing the update page data to the erased area as an addendum, and by making unavailable the original page area. Accordingly, even if the page address of the writing destination is externally randomly set, the writing can be preformed with the most efficiency in consideration of the configuration of the flash memory, e.g., writing to a free area in serial.

With such a technique, there is no need to save data of the original block at the time of data rewriting, and the flash memories 35 and 36 seem not under constraints of the erase blocks so that the high-speed random access is achieved on a super page basis.

As in the embodiment, when the sub blocks are configured by segmentation based on a super page, it is difficult to check the writing efficiency with the erase block level. In this sense, with the combination of the mechanism that is rarely put under constraints of the erase blocks, the storage system can have the maximum efficiency.

The super page herein is a basic unit of successive data that is collectively written to the flash memories 35 and 36. When the super page is configured by a page group from a plurality of devices, no constraint is added to data transfer to each of the devices, or timing setting for writing.

In this embodiment, two 16-bit IO chips are connected to a 32-bit bus so that the operation is perfectly performed in parallel. However, if the two chips share the same 16-bit bus, the data transfer has to be performed separately. With this being the case, during data transfer from the page buffer 32 to either of the memory chips, writing may be started in the remaining memory chip, or after data transfer is sequentially performed to those memory chips, writing may be started in both of the memory chips at the same time.

That is, when these devices are regarded as substantially a single flash memory device, the basic unit of the collective writing is a super page irrespective of the internal operation timing.

With FIG. 3 example, a circuit group MFLD including the flash memories 35 and 36 or the page buffer 32 and the transfer control circuit 37 connected on the memory bus 33 is regarded as a single flash memory device. The super page being a collective write unit therefor is a page group including writing pages of the flash memories 35 and 36.

As such, described is the embodiment in which a writing data group is segmented into sub blocks with a page being a collective write unit of a flash memory as a cell, and for each of the sub blocks, a writing destination is selected.

Many types of a current file storage using a flash memory adopts a previous technique of managing rewriting of the flash memory on an erase block basis.

With such a technique, for rewriting a part of an erase block, the effective data is often required to be saved for the erase block in its entirety as described above. This results inconsiderably a large overhead, and for the purpose of reducing such a possibility, the erase block is used as a basis for setting of a cell, and a writing destination is optimized therefor. If this is the case, it is likely to increase the capability.

Described now is a second embodiment in which the invention is applied to such a case.

FIG. 7 is a diagram showing the configuration of a file storage device of the second embodiment of the invention.

A file storage device 30b is configured to include an interface circuit (I/F) 31b, a page buffer 32b, a memory bus 33b, a control circuit 34b, a NAND flash memories 35b and 36b, a control circuit 37b, a cache memory 38b, and an internal bus 39b. The control circuit 34b includes a cache management table 45b, and an erase block management table 46b.

The file storage device 30b of the second embodiment is of the configuration almost similar to that of the first embodiment, except that no address conversion is performed on a page unit basis.

In the file storage device 30b, the 32-bit memory bus 33b is connected in parallel with the two-chip NAND flash memories 35b and 36b having an input/output of 16 bits. The two-chip NAND flash memories 35b and 36b are accessed simultaneously in parallel for data reading and writing.

The flash memories 35b and 36b each make an access for data writing and reading for every page of 4 kB, for example.

As the super page size, 8 kB is thus collectively accessed.

The page buffer 32b temporarily stores therein data of any accessed page area.

The data exchange among the flash memories 35b and 36b and the page buffer 32b is under the control of the control circuit 37b.

The control circuit 37b also applies error correction to transfer data as required by ECC coding, or manages any defective block in the flash memories. The flash memories 35b and 36b receive/forward data from/to the internal bus 39b of the file storage device via the page buffer 32b.

That is, the circuit group FLMD including the flash memories 35b and 36b or the page buffer 32b and the transfer control circuit 37b connected on the memory bus 33b configures substantially one flash memory device, and is regarded as being connected to the internal bus 39b of the storage device 30b.

The internal bus 39b is connected with the cache memory 38b for data writing, the I/F circuit 31b, and the control circuit 34b.

The I/F circuit 31b takes charge of data or command exchange with a host in accordance with specifications such as ATA or PCI express.

The control circuit 34b manages data exchange inside of the file storage device 30b, i.e., among the page buffer 32b, the cache memory 38b, and the I/F circuit 31b. A RAM equipped in the control circuit 34b configures the erase block management table 46b, and the cache memory management table 45b.

The control circuit 34b uses the erase block management table 46b, and forwards a command to the transfer control circuit 37b, thereby exercising control also over the storage device 30b being a flash memory device for data rewriting on an erase block basis. That is, a save process is executed to any effective page from the original block to a backup block through the page buffer 32b, and updates the erase block management table 46b so that a physical block address corresponding to any logic block address is changed. The control circuit 34b also erases the original block.

Figure 9:
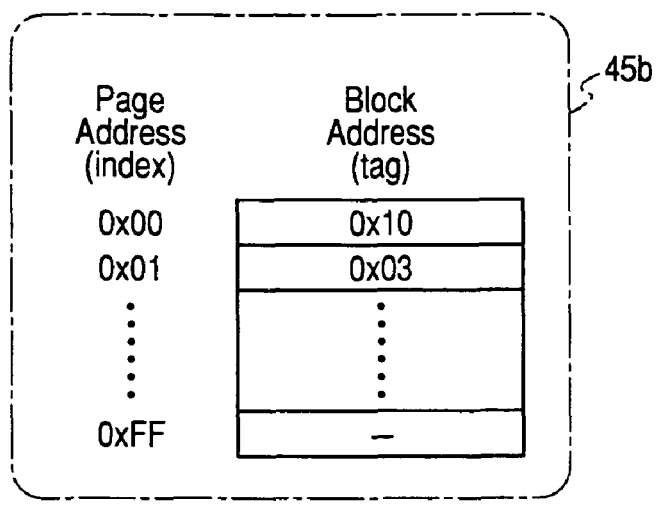
FIG. 9 is a diagram showing an exemplary configuration of a cache management table of the second embodiment of the invention.

FIG. 9 is a diagram showing an exemplary configuration of the cache management table 45b of the second embodiment.

An entry to the cache memory 38b is configured with a unit of super page, i.e., 16 sectors. In this example, adopted is direct bitmap with an index of page address in an erase block. That is, for every page address in the erase block, an entry is separately assigned.

Assuming that an external input sector address is "0x0301A", a logic page address LA of the erase block is the high-order 2 bits of "0x03", a page address is lower-order of "0x01", and a sector address is the lowest order of "0xA".

With the table of FIG. 9, an entry of the page address "0x01" being an index carries therein a page starting from an erase block of "0x03". That is, this sector "0x0301A" hits the cache memory.

In the above example, because the super page size is 8 kB and has 256 entries, the cache size requires 2 Mbytes. The cache memory is surely configured similarly to the first embodiment, or takes various other types of configuration. Although the configuration of the cache memory changes the unit of an entry, the basic algorithm of the invention is applicable irrespective of the configuration of the cache memory.

Figure 10:
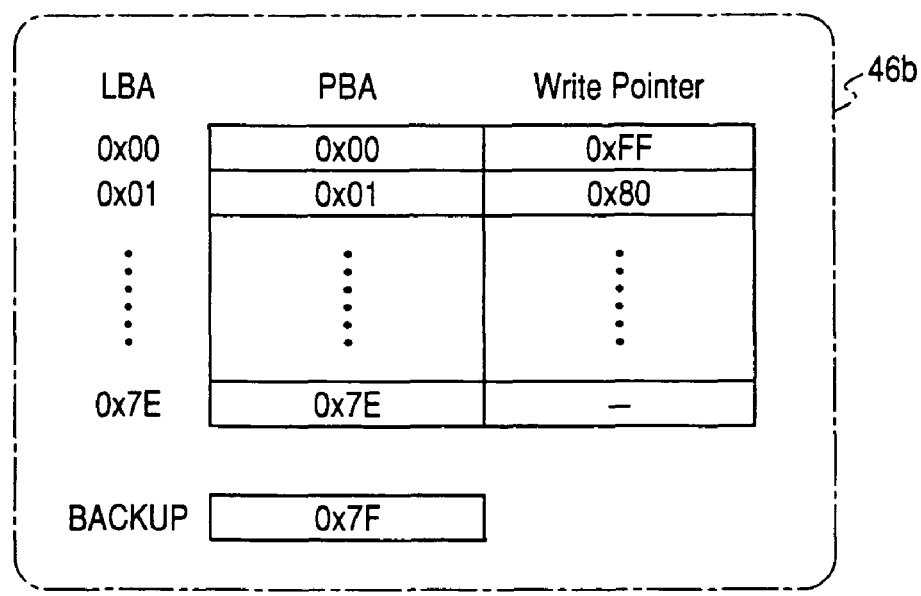
FIG. 10 is a diagram showing an exemplary configuration of an erase management table of the second embodiment of the invention.

FIG. 10 is a diagram showing an exemplary configuration of the erase block management table of the second embodiment.

As shown in FIG. 10, the erase block management table 46b stores therein physical block addresses (PBA) and logic block addresses (LBA) with a one-to-one relationship therebetween, and a write pointer.

The write pointer indicates to which page the writing is through for each corresponding block.

As described above, there needs to write the data of the flash memory in the forward direction in the erase block from the page address "0x00" to "0xFF". For example, the write pointer of the erase block "0x00" is "0xFF", and this means that the erase block is full. Therefore, to update the data in this erase block, some data has to be erased.

On the other hand, the write pointer of the erase block "0x01" is "0x80", and this means that the page areas after "0x81" are available for writing with no change. Assuming that a page "0xA0" is written thereto, the pointer moves to "0xA0" at a dash. The write pointer of an erase block "0x7E" points nowhere, i.e., a number other than a predetermined value is entered, and it means that no writing is performed at all after the block is erased.

In this embodiment, the procedure of data reading is almost similar to that of the first embodiment, except that address conversion is performed not on a page unit basis but on a block unit basis.

Considered here is a case of writing a sector "0x0011a" to the side of the flash memory device 30b after update of the sector. In such a case, the following process has to be executed.

An erase block (LBA) "0x00" is already fully written, and cannot be overwritten.

Accordingly, the control circuit 34b sequentially copies the page data of the original block (PBA) "0x00" to a backup block (PBA) "0x7F". That is, the data in each of the page areas is read to the page buffer 32b for once from the head, and then is written to the backup block at the relative positions. In this case, when the page buffer 32b receives the page "0x11" including the sector to be updated, the data of a sector "0xa" is updated on the buffer. Thereafter, when the last page is through with data copying, a physical block (PBA) corresponding to the logical block (LBA) "0x00" is changed to (PBA) "0x7F". The original block (PBA) "0x00" is then erased, and a backup block is put into use.

That is, in such a case, updating a sector requires saving of the effective data in the entire erase block, and erasing of the original block. Such block saving and erasing reduces the writing capability to a considerable extent. However, if the cache memory takes charge of such updating, the overhead can be prevented from being large.

Note here that, similarly to the first embodiment, for writing to the cache memory 38, if there is any cache miss, and if the memory has no free space for entry addition, any existing entry has to be once released to make some space available. The data of thus released entry has to be written again to the flash memories 35b and 36b after all, and the operation is similar to the writing to the cache memory 38b.

In the second embodiment, a transfer block is segmented by a cell on an erase block basis, and the access procedure is determined for every unit cell. Exemplified here is the writing of block data covering the range of sector addresses "0x0080C" to "0x0002C". The block data is thus segmented into three sub blocks as below.

Cell 1 (sub block 1): "0x0080C" to "0x00FFF"
Cell 2 (sub block 2): "0x01000" to "0x01FFF"
Cell 3 (sub block 3): "0x02000" to "0x0200C"

For each of the sub blocks segmented as such, the optimum writing destination is selected. Described below are exemplary determination criteria by referring to FIG. 11.

Considered here is a measure to be taken against the worst case, i.e., the entries of the cache memory are all full, and every writing sector results in a cache miss.

To perform writing in such a case, there needs to release the entries as many as needed for writing, and write the data in the released entries back to the flash memories 35b and 36b. As a result, the larger the data size for writing, the likelier it becomes that the processing amount therefor is increased, and the disadvantages of using the cache memory become more obvious.

For example, the sub block 2 is of 256 pages, and includes the whole of an erase block "0x01". Storing such a sub block 2 into the cache memory 38b consumes all of the entries. With this being the case, there needs to release 256 entries at worst belonging to each different erase block, and to perform page writing to 256 erase blocks of the flash memories.

On the other hand, if this sub block is written to the flash memories as it is, the writing will do for a page. As such, in such a case, writing to the cache memory 38b will cause adverse effects if anything.

On the other hand, the sub block 3 is configured by 13 sectors belonging to an erase block "0x02", and consumes only an entry of the cache memory 38b. Accordingly, even in the worst case as above, one entry is to be released from the cache memory, and data of the entry is to be written again to the flash memories so that writing to the same erase block will do. When there is a cache hit in the cache memory 38b, or when the memory has any free space for entry addition, the processing can be completed at high speed without making an access to the flash memories. Accordingly, writing this sub block to the side of the cache memory 38b will lead to better efficiency most of the time.

Also in the second embodiment, any appropriate writing destination can be selected using an algorithm similarly to the first embodiment.

With an exemplary effective writing technique, the sub blocks as a result of segmentation on an erase block basis are each subjected to a test to see the level of data occupation in the cell, and based on the test result, a writing destination is selected either a flash memory or a cache memory for the data.

That is, the determination criteria are set to the number of sectors for writing to each of the sub blocks, or the number of entries to be consumed at the time of writing to the cache memory 38b. When such determination criteria show a value larger than a predetermined number, writing is performed to the flash memories 35b and 36b, and if with a value equal to or smaller than the predetermined value, writing is performed to the cache memory 38b.

The number of sectors in each of the sub blocks or the number of entries to be consumed can be instantaneously captured from address information. Accordingly, by selecting a writing destination for data as appropriate using such a determination algorithm, the writing efficiency and performance can be both increased with ease.

Alternatively, the entries of the cache memory 38b may be checked to see whether there is any data hit or free space for entry addition, thereby deriving the number of entries to be added or to be released when the sub blocks are each written to the cache memory 38b. Whenever necessary, thus found number is used as a basis to select a writing destination. That is, when there needs to add or release more entries than as predetermined, writing is performed to the flash memories 35b and 36b, and when less entries than as predetermined are to be added or released, writing is performed to the cache memory 38b.

Alternatively, at the time of writing to the flash memories 35b and 36b, any data that can be written back to the erase block from the cache memory 38b is checked, and the result is used for determination.

Assuming that the sub block 3 is written to the flash memories as it is, the cache table 45b is searched to find any entry corresponding to an erase block of the same cell 3.

That is, although the sub block 3 is belonging to the erase block "0x02", if the cache memory carries therein any entry of the same erase block, and if writing to the erase block requires erasing, the data can be written back to the flash memories when the page is subjected to a save process. Such an entry is cleared, and can be released whenever necessary. That is, the total number of pages that can be simultaneously written to the flash memories 35b and 36b is used as criteria, and when the value is larger than a predetermined value, writing is performed to the flash memories as it is.

When an erase block is a basic management unit for rewriting as in the second embodiment, the free space of the block being a writing destination largely changes the amount of operation to be executed. This is true as described about the erase block management table 46b of FIG. 7 even in a case where the same page is written to the same position of the block.

Accordingly, the free space of the block is checked by referring to the erase block management table 46b, and when the original erase block is available for writing as it is, the writing destination is determined as the flash memories 35b and 36b, and other than that, any of the above-described selection criteria are used as a basis so that the writing can be performed with efficiency.

As such, there are various types of selection algorithm, which can be combined together as appropriate. The basic procedure is as follows.

1. An input command and address information are acquired.
2. Based on a cell of an erase block, block data is segmented into sub blocks, and each of the sub blocks is sequentially subjected to a writing process.
3. At this time, a test is executed to see the level of data occupation in the sub blocks, the cache table is checked, or the erase block being a writing destination is checked for its free space, and based on the test result, the writing destination is selected.

With the determination of 3 above, for writing of each of the sub blocks, it is preferable to determine a procedure considering the time needed for determination and the complication level of the processing in view of:

reducing the frequency of block erasing in the cache memory; and if with block erasing, writing updated data as many as possible when the block is subjected to a series of processes.

When the sub block is written to the flash memory side, similarly to the first embodiment, any data-hit entry is processed for matching with the cache memory. As a specific measure therefor, data in the corresponding entry is updated by data of the sub block, or the corresponding entry itself is released.

When at least block erasing is needed for writing the sub block to the flash memories, as described above, the cache table 45b is searched also for sectors in the same cell (same page) but not in the sub block. When there is any hit entry, i.e., entry belonging to the erase block same as the writing destination, the data thereof is preferably written to the flash memories at the same time. The written-back entry is cleared, and can be released whenever necessary.

Described above is the case that a semiconductor storage device itself selects either a cache memory or a flash memory as a writing destination. As to the writing procedures or selection algorithms of the embodiments of the invention, any other case is surely applicable.

Exemplary with a computer system equipped with a flash memory device serving as a file storage, a CPU (Central Processing Unit) often configures a cache memory or an address conversion table in the system memory for use for the flash memory device, and driver software takes charge of writing management for the flash memory device.

Figure 12:
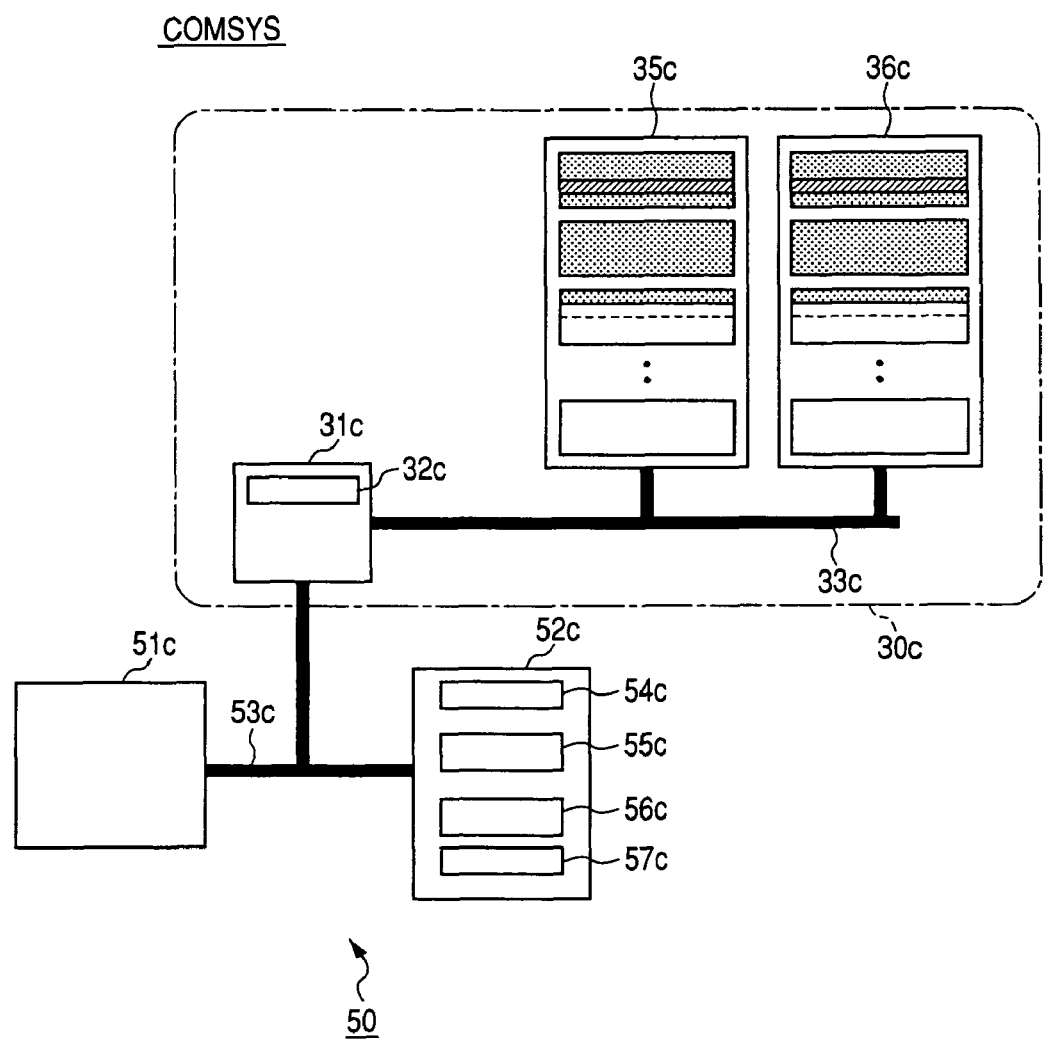
FIG. 12 is a diagram showing an exemplary configuration of a computer system of the embodiments of the invention.

FIG. 12 is a diagram showing an exemplary configuration of such a computer system of the embodiment.

In FIG. 12, a computer system COMSYS mainly includes a flash memory device 30c serving as a file storage device, and a processing device 50.

The flash memory device 30c includes a bridge circuit 31c including a page buffer 32c, and NAND flash memories 35c and 36c.

The processing device 50 includes a CPU 51c, a system memory 52c being a RAM, and a system bus 53c.

The CPU 51c is connected to the RAM, i.e., system memory 52c, via the 32-bit system bus 53c.

The system bus 53c is connected with the bridge circuit 31c of the flash memory device 30c. The bridge circuit 31c is connected with a 32-bit data bus 33c, which is connected in parallel with the two-chip NAND flash memories 35c and 36c having an input/output of 16 bits.

The two-chip NAND flash memories 35c and 36c are accessed simultaneously in parallel for data reading and writing.

The page buffer 32c temporarily stores therein data of any accessed page area, and is provided inside of the bridge circuit 31c.

The bridge circuit 31c receives various types of commands from the CPU 51c, and using the page buffer 32c, helps data exchange among the CPU 51c or the system memory 52c and the flash memories 35c and 36c.

The bridge circuit 31c receives the commands for making an access to any predetermined page of the flash memories 35c and 36c, erasing any predetermined block of the flash memories, copying any predetermined page to a specific address, resetting the flash memories, and others. That is, in view of the CPU 51c, the components subsequent to the bridge circuit 31c are regarded as a single piece of flash memory device 30c.

On the other hand, in the system memory 52c, a driver 54c is resident for controlling the flash storage system (file storage device). In response to the access made to the storage device from an operating system (OS) or application, this driver 54c refers to an address conversion table 55c in the same memory to convert the page address at the time when the address is made. The address conversion table 55c here is equivalent to the address conversion table 38c in the first and second embodiments.

The system memory 52c also includes a cache memory area 56c of the flash memory device, and a cache table 57c.

In such a case, the driver 54c receives a writing request to the file storage issued from the application, and from the address information, either the cache memory area 56c or the flash memory device 30c is selected as a writing destination of the data block. At this time, with exactly the same procedure as the above-described embodiments, the writing efficiency can be favorably increased.

That is, data is segmented into sub blocks based on a unit cell derived based on a writing page or an erase block of the flash memory device 30c, and for each of the resulting sub blocks, a writing destination is selected based on any exiting criteria.

When a unit cell is a page being a collective write unit, the sub blocks may be checked for their level of data occupation or the cache table 57c may be checked, and based on the check result, the selection may be accordingly made.

When a unit cell is an erase block being a collective erase unit, checked are the sub blocks for their level of data occupation, the cache table 57c, or the vacancy of the erase blocks in the flash device 30c being a writing destination. Based on the check result, the selection may be accordingly made.

Note here that the cache memory in the semiconductor storage device or the computer system of the embodiments of the invention may be a volatile RAM, e.g., SRAM (Static Random Access Memory) or DRAM (Dynamic Random Access Memory). If the semiconductor storage device is a mobile medium, however, the cache memory needs to be resistant to instantaneous power interruption, e.g., abrupt removal. If the semiconductor storage device is built-in type, the cache memory needs to be resistant to instantaneous power interruption of the computer equipment itself.

In this sense, it is desirable that the cache memory is a nonvolatile RAM such as ferroelectric memory, and the cache table or the address conversion table is stored in such a nonvolatile RAM.

Figure 13:
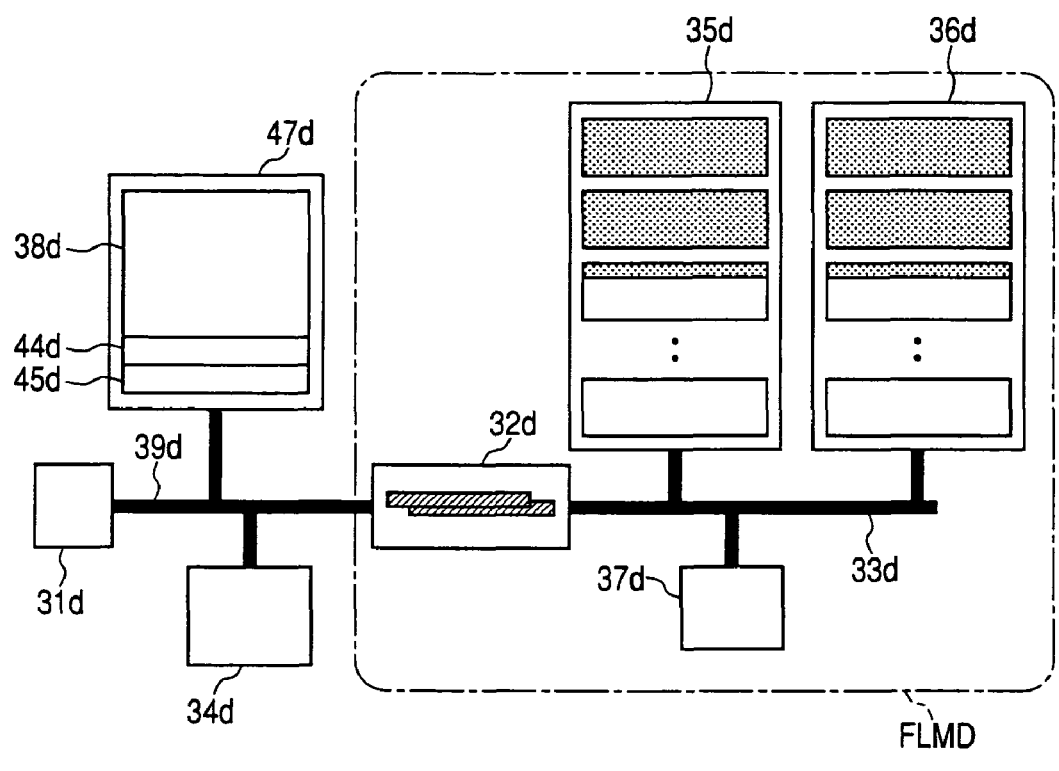
FIG. 13 is a diagram showing an exemplary configuration of a file storage device in which the above-described cache memory is a nonvolatile RAM (Random Access Memory) such as ferroelectric memory.

FIG. 13 is a diagram showing an exemplary configuration of a file storage device in which the cache memory is a nonvolatile RAM such as ferroelectric memory.

A file storage device 30d is configured to include an interface circuit (I/F) 31d, a page buffer 32d, a memory bus 33d, a control circuit 34d, NAND flash memories 35d and 36d, a control circuit 37d, an internal bus 39d, and a ferroelectric memory 47d.

In the file storage device 30d, the 32-bit memory bus 33d is connected in parallel with the two-chip NAND flash memories 35d and 36d having an input/output of 16 bits.

The two-chip NAND flash memories 35d and 36d are accessed simultaneously in parallel for data reading and writing.

The flash memories 35d and 36d each make an access for data writing and reading for every page of 4 kB, for example.

As the super page size, 8 kB is thus collectively accessed.

The page buffer 32d temporarily stores therein data of any accessed page area.

The data exchange among the flash memories 35d and 36d and the page buffer 32d is under the control of the control circuit 37d.

The control circuit 37d also applies error correction to transfer data as required by ECC coding, or manages any defective block in the flash memories. The flash memories 35d and 36d receive/forward data from/to the internal bus 39d of the storage device via the page buffer 32d.

That is, the circuit group FLMD including the flash memories 35d and 36d or the page buffer 32d and the transfer control circuit 37d connected on the memory bus 33d configure substantially one flash memory device, and is regarded as being connected to the internal bus 39d of the storage device.

The internal bus 39d is connected with the ferroelectric memory 47d, the I/F circuit 31d, and the control circuit 34d. The I/F circuit 31d takes charge of data or command exchange with a host in accordance with specifications such as ATA or PCI express.

The ferroelectric memory 47d includes a cache memory 38d whose entry is 1/N (where N is an integer of two or larger) of a super page size, an address conversion table 44d for managing virtual addresses on a page basis, and a cache memory management table 45d.

The control circuit 34d manages, inside of the storage device 30d, data exchange among the page buffer 32d, the cache memory 38d, and the I/F circuit 31d.

Alternatively, the cache memory 38d and the control circuit 34d of FIG. 11 may be combined as an IC (Integrated Circuit) chip, and may be manufactured at the same time.

Still preferably, the components, i.e., the I/F circuit 31d, the page buffer 32d, and the control circuit 37d, may be combined to an IC chip, and the file storage device may be configured as an SIP (System In Package) including the resulting IC chip and the flash memories.

Note here that, the nonvolatile RAM includes FeRAM (Ferroelectric RAM) using a ferroelectric film, an MRAM (Magnetic RAM) using a ferromagnetic element, OUM (Ovonic Unified Memory) using a phase change material, RRAM (Redudant RAM), or others.

The FeRAM is a semiconductor memory that stores therein data utilizing a polarization direction difference of a ferroelectric capacitor. For example, S. Sheffeield, et al. describe exemplary FeRAM in U.S. Pat. No. 4,873,664.

The MRAM is a semiconductor memory that stores therein data utilizing a spin direction difference of the ferromagnetic film. For example, R. Scheuerlein, et al. write a paper on ISSCC2000 (Digest, pp 128).

The OUM is a semiconductor memory that stores therein data utilizing phase transfer of a chalcogenide film, for example. As an example, S. Lai, et al. write a paper on IEDM2001 (Digest, pp 803).

The RRAM is a semiconductor memory that stores therein data utilizing resistance hysteresis of a magneto-resistance effect material. For example, W. W. Zhuang, et al. write a paper on IEDM2002 (Digest, 7.5).

These nonvolatile memories are all better in digit performance compared with the flash memories in terms of access speed or rewriting frequency with the cell level.

It should be understood by those skilled in the art that various modifications, combinations, sub-combinations and alterations may occur depending on design requirements and other factors insofar as they are within the scope of the appended claims or the equivalents thereof.

What is claimed is:

1. A storage device, comprising:
a flash memory device being a main storage medium;
a cache memory for use for the flash memory device; and
a control circuit, wherein
based on a write command and address information provided from outside, the control circuit selects either the flash memory device or the cache memory as a writing destination of input data, wherein
a unit cell is set based on a write unit or an erase unit of the flash memory device, and the unit cell includes a plurality of sectors, and
when a write command comes for writing of block data to any of the sectors or successive sector groups, the control circuit segments the block data into sub blocks in accordance with the unit cell, and selects either the flash memory device or the cache memory as the writing destination of each of the sub blocks in accordance with predetermined criteria for each of the sub blocks, wherein the unit cell includes one or more writing pages, and is a collective write unit of the flash memory device, and wherein for each of the sub blocks, the control circuit checks an entry of the cache memory corresponding to the unit cell or data therein, and based on a check result, selects the writing destination for each of the sub blocks.

2. The storage device according to claim 1, wherein in data of any of the sub blocks whose writing destination is selected as the flash memory device, when there is data hit in the cache memory, the control circuit releases a corresponding entry on the cache memory.

3. The storage device according to claim 1, wherein in data of any of the sub blocks whose writing destination is selected as the flash memory device, when there is data hit in the cache memory, the control circuit updates a corresponding entry on the cache memory by the input data.

4. The storage device according to claim 1, wherein when the cache memory carries therein an entry corresponding to an area in the unit cell same as any of the sub blocks whose writing destination is selected as the flash memory device, the control circuit combines the entry with data of the sub block, and writes resulting data back to the flash memory device.

5. A storage device, comprising:
a flash memory device being a main storage medium;
a cache memory for use for the flash memory device; and
a control circuit, wherein
based on a write command and address information provided from outside, the control circuit selects either the flash memory device or the cache memory as a writing destination of input data, wherein
a unit cell is set based on a write unit or an erase unit of the flash memory device, and the unit cell includes a plurality of sectors, and
when a write command comes for writing of block data to any of the sectors or successive sector groups, the control circuit segments the block data into sub blocks in accordance with the unit cell, and selects either the flash memory device or the cache memory as the writing destination of each of the sub blocks in accordance with predetermined criteria for each of the sub blocks, wherein the unit cell includes one or more writing pages, and is a collective write unit of the flash memory device, and wherein the control circuit subjects each of the sub blocks to a test to check a level of data occupation in the unit cell, and based on a test result, selects the writing destination for each of the sub blocks.

6. A storage device, comprising:
a flash memory device being a main storage medium;
a cache memory for use for the flash memory device; and a control circuit, wherein
based on a write command and address information provided from outside, the control circuit selects either the flash memory device or the cache memory as a writing destination of input data, wherein
a unit cell is set based on a write unit or an erase unit of the flash memory device, and the unit cell includes a plurality of sectors, and
when a write command comes for writing of block data to any of the sectors or successive sector groups, the control circuit segments the block data into sub blocks in accordance with the unit cell, and selects either the flash memory device or the cache memory as the writing destination of each of the sub blocks in accordance with predetermined criteria for each of the sub blocks, wherein the unit cell includes one or more erase blocks, and is a collective erase unit of the flash memory device, and wherein the control circuit subjects each of the sub blocks to a test to check a level of data occupation in the unit cell, and based on a test result, selects the writing destination for each of the sub blocks.

7. A storage device, comprising:
a flash memory device being a main storage medium;
a cache memory for use for the flash memory device; and
a control circuit, wherein
based on a write command and address information provided from outside, the control circuit selects either the flash memory device or the cache memory as a writing destination of input data, wherein
a unit cell is set based on a write unit or an erase unit of the flash memory device, and the unit cell includes a plurality of sectors, and
when a write command comes for writing of block data to any of the sectors or successive sector groups, the control circuit segments the block data into sub blocks in accordance with the unit cell, and selects either the flash memory device or the cache memory as the writing destination of each of the sub blocks in accordance with predetermined criteria for each of the sub blocks, wherein the unit cell includes one or more erase blocks, and is a collective erase unit of the flash memory device, and wherein for each of the sub blocks, the control circuit checks an entry of the cache memory corresponding to the unit cell or data therein, and based on a check result, selects the writing destination for each of the sub blocks.

8. A storage device, comprising:
a flash memory device being a main storage medium;
a cache memory for use for the flash memory device; and
a control circuit, wherein
based on a write command and address information provided from outside, the control circuit selects either the flash memory device or the cache memory as a writing destination of input data, wherein
a unit cell is set based on a write unit or an erase unit of the flash memory device, and the unit cell includes a plurality of sectors, and
when a write command comes for writing of block data to any of the sectors or successive sector groups, the control circuit segments the block data into sub blocks in accordance with the unit cell, and selects either the flash memory device or the cache memory as the writing destination of each of the sub blocks in accordance with predetermined criteria for each of the sub blocks, wherein the unit cell includes one or more erase blocks, and is a collective erase unit of the flash memory device, and wherein for each of the sub blocks, the control circuit checks a free space on the flash memory device for the unit cell, and based on a check result, selects the writing destination for each of the sub blocks.

9. A data writing method for a storage device including a flash memory device, and a cache memory area for use for the flash memory device, comprising:
setting a unit cell including a plurality of sectors based on a write unit or an erase unit of the flash memory device;
segmenting block data into sub blocks in accordance with the unit cell when a write command comes for writing of the block data to any of the sectors or successive sector groups; and
selecting either the flash memory device or the cache memory area as the writing destination of each of the sub blocks in accordance with predetermined criteria for each of the sub blocks,
wherein the unit cell is a collective write unit for the flash memory device including one or more writing pages, and
the writing destination for each of the sub blocks is selected based on a result of a test about a level of data occupation in the corresponding unit cell, or an entry of the cache memory area corresponding to the unit cell.

10. A data writing method for a storage device including a flash memory device, and a cache memory area for use for the flash memory device, comprising,
setting a unit cell including a plurality of sectors based on a write unit or an erase unit of the flash memory device;
segmenting block data into sub blocks in accordance with the unit cell when a write command comes for writing of the block data to any of the sectors or successive sector groups; and
selecting either the flash memory device or the cache memory area as the writing destination of each of the sub blocks in accordance with predetermined criteria for each of the sub blocks,
wherein the unit cell is a collective erase unit for the flash memory device including one or more erase blocks, and
the writing destination for each of the sub blocks is selected based on a result of a test about a level of data occupation in the corresponding unit cell, an entry of the cache memory area corresponding to the unit cell, or a state of a free space in the corresponding unit cell on the flash memory device.

* * * * *